United States Patent
Jung et al.

(10) Patent No.: US 11,107,988 B2
(45) Date of Patent: Aug. 31, 2021

(54) RESISTIVE RANDOM ACCESS MEMORY DEVICE COMPRISING METAL HALIDE AND METHOD FOR PREPARING THE SAME

(71) Applicants: Research & Business Foundation Sungkyunkwan University, Suwon-si (KR); GLOBAL FRONTIER CENTER FOR MULTISCALE ENERGY SYSTEMS, Seoul (KR)

(72) Inventors: Hyun Suk Jung, Seoul (KR); Sang Myeong Lee, Suwon-si (KR); Byeong Jo Kim, Suwon-si (KR); Jae Bum Jeon, Suwon-si (KR); Gi Joo Bang, Suwon-si (KR); Won Bin Kim, Suwon-si (KR); Dong Geon Lee, Suwon-si (KR)

(73) Assignees: Research and Business Foundation Sungkyunkwan University, Suwon-si (KR); Global Frontier Center for Multiscale Energy Systems, Seoul (KR)

( * ) Notice: Subject to any disclaimer, the term of this patent is extended or adjusted under 35 U.S.C. 154(b) by 348 days.

(21) Appl. No.: 16/227,199

(22) Filed: Dec. 20, 2018

(65) Prior Publication Data
US 2019/0189919 A1  Jun. 20, 2019

(30) Foreign Application Priority Data
Dec. 20, 2017 (KR) .......... 10-2017-0175698

(51) Int. Cl.
| H01L 45/00 | (2006.01) |
| G11C 11/56 | (2006.01) |
| G11C 13/00 | (2006.01) |
| C07F 19/00 | (2006.01) |

(52) U.S. Cl.
CPC ........ H01L 45/147 (2013.01); G11C 11/5664 (2013.01); G11C 13/0007 (2013.01); H01L 45/04 (2013.01); H01L 45/1233 (2013.01); H01L 45/1253 (2013.01); H01L 45/14 (2013.01); H01L 45/1608 (2013.01); C07F 19/00 (2013.01)

(58) Field of Classification Search
CPC .................. G11C 11/5664; H01L 45/147
See application file for complete search history.

(56) References Cited

U.S. PATENT DOCUMENTS

2008/0308781 A1* 12/2008 Liao ............... H01L 45/1633
                                                          257/2
2018/0248052 A1* 8/2018 Seok .............. H01L 31/022425
2020/0294728 A1* 9/2020 Zhu ................. H01L 51/4253

FOREIGN PATENT DOCUMENTS

| KR | 10-0983175 B1 | 9/2010 |
| KR | 10-2015-0011002 A | 1/2015 |
| KR | 10-2017-0049758 A | 5/2017 |
| KR | 10-2017-0113453 A | 10/2017 |

* cited by examiner

Primary Examiner — Thao X Le
Assistant Examiner — Xia L Cross
(74) Attorney, Agent, or Firm — NSIP Law

(57) ABSTRACT

The present disclosure relates to a resistive random access memory device and a preparing method thereof.

8 Claims, 9 Drawing Sheets

RESISTIVE RANDOM ACCESS MEMORY DEVICE COMPRISING METAL HALIDE AND METHOD FOR PREPARING THE SAME

TECHNICAL FIELD

The present disclosure relates to a resistive random access memory device and a preparing method thereof.

BACKGROUND OF THE INVENTION

A non-volatile memory has the advantage of ROM in that information stored therein is not erased even when power is not supplied and the advantage of RAM in that information can be easily input and output. Thus, the non-volatile memory is suitable for a mobile device such as a mobile phone, or the like. Examples of the non-volatile memory may include a resistive random access memory (RRAM), a magnetic random access memory (MRAM), a ferroelectric random access memory (FRAM), a phase-change random access memory (PRAM), and the like. Particularly, the resistive random access memory is one of the next-generation non-volatile memory devices with considerable competitiveness as compared with flash memory due to its features of low power, ultra-high speed, non-volatility, and simple structure.

A resistive random access memory device which has received a lot of attention as a next-generation memory device due to its high-density and low-power characteristics may increase or decrease an electric resistance using an electric signal to record information depending on a resistance state. The resistive random access memory device employs a simple device structure (metal/oxide/metal) and is configured to switch from a high resistance state unsuitable for conduction to a low resistance state suitable for conduction when an appropriate voltage/current is applied. These two resistance states are distinguished by a difference between "0" and "1" and the resistive random access memory device refers to a memory device that recognizes the resistance states. Resistive random access memory devices are classified in more detail into a phase-change access memory (PRAM) using phase change, a magnetic RAM (MRAM) using spin change, and a resistive RAM (RRAM) using the movement of ions in a material, depending on a method of switching a resistance in a material.

The resistive random access memory device has a structure in which an upper electrode and a lower electrode are placed on a thin film and a resistance change layer formed of an oxide thin film is interposed between the upper and the lower electrodes. The memory operates by changing the resistance of the resistance change layer depending on a voltage applied to the resistance change layer.

The resistance of the resistive random access memory device is changed as a metal filament is formed and eliminated by redox reactions of metal atoms or metal ions permeating from a metal electrode into the resistance change layer depending on a voltage applied to the resistance change layer. As materials of the resistance change layer, solid electrolyte materials such as oxides or GeS have been used mainly. However, an oxide-based solid electrolyte material shows a very unstable distribution of HRS/LRS resistances and SET/RESET voltages and it is very difficult to manipulate them. Accordingly, the development of new materials of the resistance change layer is needed to solve this problem.

Korean Patent No. 10-0983175 discloses a resistive RAM having an oxide layer and a solid electrolyte layer and a method for operating the same.

DISCLOSURE OF THE INVENTION

Problems to be Solved by the Invention

In view of the foregoing, the present disclosure provides a resistive random access memory device in which a metal halide is mixed in a resistance change layer having a conventional perovskite structure to exhibit higher durability and higher efficiency than conventional resistive random access memory devices and a preparing method thereof.

However, problems to be solved by the present disclosure are not limited to the above-described problems. There may be other problems to be solved by the present disclosure.

Means for Solving the Problems

According to a first aspect of the present disclosure, there is provided a resistive random access memory device, including: a resistance change layer formed on a first electrode; and a second electrode formed on the resistance change layer, and the resistance change layer comprises an organic metal halide having a first perovskite crystal structure and a metal halide having a second perovskite crystal structure.

According to an embodiment of the present disclosure, the resistance change layer may contain 10 wt % or more of the metal halide having the second perovskite crystal structure, but may not be limited thereto.

According to an embodiment of the present disclosure, the resistive random access memory device may further include a polymer protective layer formed on the resistance change layer, but may not be limited thereto.

According to an embodiment of the present disclosure, the organic metal halide having the first perovskite crystal structure may have a tetragonal perovskite structure, but may not be limited thereto.

According to an embodiment of the present disclosure, the metal halide having the second perovskite crystal structure may have an orthorhombic perovskite structure, but may not be limited thereto.

According to an embodiment of the present disclosure, the organic metal halide having the first perovskite crystal structure may be represented by the following Chemical Formula 1, but may not be limited thereto:

$$RMX_3 \qquad \text{[Chemical Formula 1]}$$

(In Chemical Formula 1,

R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

According to an embodiment of the present disclosure, the metal halide having the second perovskite crystal structure may be represented by the following Chemical Formula 2, but may not be limited thereto:

$$AMX_3 \qquad \text{[Chemical Formula 2]}$$

(In Chemical Formula 2,

A is an alkali metal cation,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

According to an embodiment of the present disclosure, the polymer protective layer may include an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

According to a second aspect of the present disclosure, there is provided a preparing method of a resistive random access memory device, including: forming a resistance change layer on a first electrode; and forming a second electrode on the resistance change layer, and the resistance change layer is formed by spin-coating of a solution containing an organic halide, an alkali metal halide, and a metal halide.

According to an embodiment of the present disclosure, the preparing method may further include forming a hydrophilic group on a surface of the first electrode by performing UV ozone treatment to the first electrode before the forming of the resistance change layer, but may not be limited thereto.

According to an embodiment of the present disclosure, the solution may contain the organic halide, the alkali metal halide, and the metal halide at a molar ratio of 1−x:x:1 ($0.1 \leq x \leq 0.8$), but may not be limited thereto.

According to an embodiment of the present disclosure, the organic halide may be represented by the following Chemical Formula 3, but may not be limited thereto:

RX                    [Chemical Formula 3]

(In Chemical Formula 3,

R is a substituted or unsubstituted $C_{1-24}$ alkyl group, and when R is substituted, its substituent is an amino group, a hydroxyl group, a cyano group, a halogen group, a nitro group, or a methoxy group, and X includes a halide anion or a chalcogenide anion).

According to an embodiment of the present disclosure, the alkali metal halide may be represented by the following Chemical Formula 4, but may not be limited thereto:

AX                    [Chemical Formula 4]

(In Chemical Formula 4,

A is an alkali metal cation, and

X includes a halide anion or a chalcogenide anion).

According to an embodiment of the present disclosure, the metal halide may be represented by the following Chemical Formula 5, but may not be limited thereto:

$MX_2$                    [Chemical Formula 5]

(In Chemical Formula 5,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

According to an embodiment of the present disclosure, the solvent may be selected from the group consisting of dimethylformamide, dimethylsulfoxide, dimethylacetamide, N-methylpyrrolidone, N-methyl-2-pyridine, pyridine, aniline, and combinations thereof, but may not be limited thereto.

According to an embodiment of the present disclosure, the first electrode and the second electrode may each independently include a material selected from the group consisting of a metal, a conductive polymer, a carbonaceous material, and combinations thereof, but may not be limited thereto.

Effects of the Invention

According to the above-described aspects of the present disclosure, it is possible to provide a resistive random access memory device in which a metal halide is mixed in a resistance change layer having a conventional perovskite structure to exhibit higher durability and higher efficiency than conventional resistive random access memory devices and a preparing method thereof.

A resistance change layer of a conventional resistive random access memory device may use an organic metal halide having a perovskite structure, which makes it possible to manufacture a resistive random access memory device having low voltage and high efficiency based on hysteresis. However, low stability of the material may result in low durability.

Meanwhile, the resistive random access memory device according to the present disclosure may have high durability by mixing a metal halide having a new perovskite structure in a resistance change layer having a conventional perovskite structure to prepare a new resistance change layer.

DETAILED DESCRIPTION OF THE EMBODIMENTS

Figure 1:
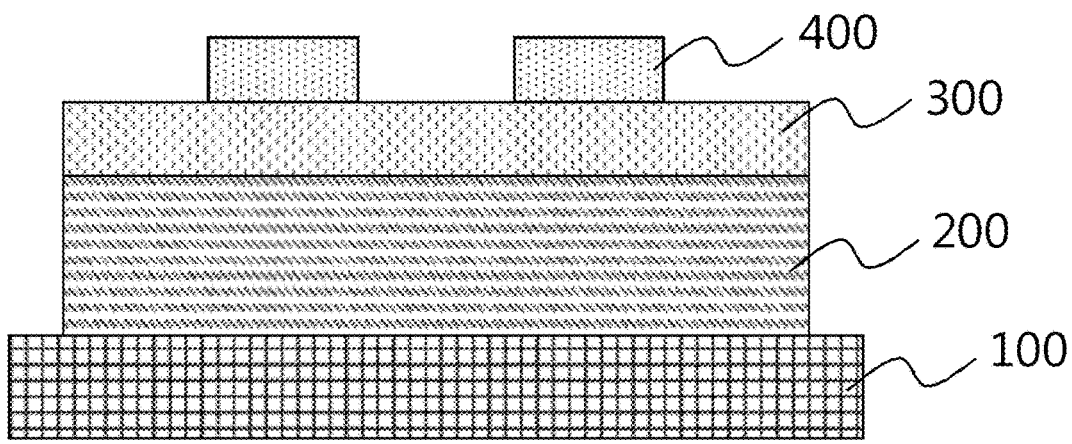
FIG. 1 is a cross-sectional view of a resistive random access memory device according to an embodiment of the present disclosure.

Hereafter, examples will be described in detail with reference to the accompanying drawings so that the present disclosure may be readily implemented by those skilled in the art. However, it is to be noted that the present disclosure is not limited to the examples but can be embodied in various other ways. In the drawings, parts irrelevant to the description are omitted for the simplicity of explanation, and like reference numerals denote like parts through the whole document.

Throughout this document, the term "connected to" may be used to designate a connection or coupling of one element to another element and includes both an element being "directly connected" another element and an element being "electronically connected" to another element via another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "alkyl group" typically refers to a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. If the alkyl group is substituted with an alkyl group, this may also be interchangeably used as "branched alkyl group". A substituent which can substitute for the alkyl group may include at least one selected from the group consisting of halo (for example, F, Cl, Br, I), haloalkyl (for example, $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having two or more carbon atoms among the above-described alkyl groups may include at least one carbon-carbon double bond or at least one carbon-carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, the alkyl group used herein may be an alkyl group having 1 to 10 carbon atoms, i.e., a methyl group, an ethyl group, a propyl group, a butyl group, a pentyl group, a hexyl group, a heptyl group, an octyl group, a nonyl group, or a decyl group, or an alkyl group having 1 to 6 carbon atoms, i.e., a methyl group, an ethyl group, a propyl group, a butyl group, a pentyl group, or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

Through the whole document, the term "halogen" or "halo" refers to a halogen element from Group 17 of the periodic table included as a functional group in a compound and may include, for example, chlorine, bromine, fluorine or iodine, but may not be limited thereto.

Through the whole document, a "perovskite" has an $ABX_3$ structure, and the $ABX_3$ structure can be readily estimated based on a tolerance factor t:

$$t=(r_A+r_X)/[2^{1/2}(r_B+r_X)].$$

Herein, $r_A$ and $r_B$ are effective ionic radiuses of cations in a cubo-octahedral A-site and an octahedral B-site, respectively, and $r_X$ is a radius of an anion.

Hereinafter, a resistive random access memory device and a preparing method thereof according to the present disclosure will be described in detail with reference to embodiments, examples and the accompanying drawings. However, the present disclosure may not be limited to the embodiments, examples, and drawings.

A first aspect of the present disclosure relates to a resistive random access memory device, including: a resistance change layer formed on a first electrode; and a second electrode formed on the resistance change layer, and the resistance change layer comprises an organic metal halide having a first perovskite crystal structure and a metal halide having a second perovskite crystal structure.

In an embodiment of the present disclosure, the resistive random access memory device may further include a polymer protective layer formed on the resistance change layer, but may not be limited thereto.

FIG. 1 is a cross-sectional view of a resistive random access memory device according to an embodiment of the present disclosure.

To be specific, the resistive random access memory device according to an embodiment of the present disclosure may include a first electrode 100, a resistance change layer 200 formed on the first electrode 100, a polymer protective layer 300 formed on the resistance change layer 200, a second electrode 400 formed on the polymer protective layer 300, but may not be limited thereto.

The first electrode 100 may be formed on a substrate, but may not be limited thereto.

The substrate may contain a material selected from the group consisting of a silicon substrate, a plastic substrate, a glass substrate, a sapphire substrate, a nitride substrate, and combinations thereof, but may not be limited thereto.

The resistance change layer 200 is formed by spin-coating of a solution containing an organic halide, an alkali metal halide, and a metal halide on the first electrode 100 and may have a two-phase mixed structure rather than an one-phase composite structure.

In an embodiment of the present disclosure, the resistance change layer 200 may contain 10 wt % or more of the metal halide having the second perovskite crystal structure, but may not be limited thereto. Desirably, the resistance change layer 200 may contain 30 wt % or more of the metal halide having the second perovskite crystal structure.

If the resistance change layer 200 comprises less than 10 wt % of the metal halide having the second perovskite crystal structure, the organic metal halide having the first perovskite crystal structure and the metal halide having the second perovskite crystal structure may have an one-phase composite structure rather than a two-phase mixed structure. Such a structure may cause a decrease in durability of the resistive random access memory device.

In an embodiment of the present disclosure, the organic metal halide having the first perovskite crystal structure may have a tetragonal perovskite structure, but may not be limited thereto.

The tetragonal perovskite structure refers to perovskite which has three crystal axes orthogonal to each other and whose two horizontal axes a and b have the same length and a vertical axis c has a different length from the horizontal axes.

In an embodiment of the present disclosure, the metal halide having the second perovskite crystal structure may have an orthorhombic perovskite structure, but may not be limited thereto.

The orthorhombic perovskite structure refers to perovskite which has three crystal axes orthogonal to each other and whose axes a, b, and c have different lengths from each other.

In an embodiment of the present disclosure, the organic metal halide having the first perovskite crystal structure may be represented by the following Chemical Formula 1, but may not be limited thereto:

$$RMX_3 \qquad \text{[[Chemical Formula 1]]}$$

(In Chemical Formula 1,

R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 1, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R is a monovalent organic ammonium ion represented by $(R^5-NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R may be represented by Chemical Formula $(R^6R^7N=CH-NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto: an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol, —SH), an alkylthio group having 1 to 10 carbon atoms, an arylthio group, a sulfonyl group, a phosphate group, a phosphate ester group, a phosphonic acid group, and a phosphonate ester group. For example, the substituted alkyl group may include a halogen alkyl group, a hydroxy alkyl group, an amino alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2-$), a benzhydryl group ($Ph_2CH-$), a trityl group (triphenylmethyl, $Ph_3C-$), phenethyl ($Ph-CH_2CH_2-$), a styryl group ($PhCH=CH-$), or a cinnamyl group ($PhCH=CHCH_2-$), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—NH$_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto: an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphate group, a phosphate ester group, a phosphonic acid group, and a sulfonyl group. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—$(C_1$-$C_6)$alkylene] or Chemical Formula [—X—$(C_1$-$C_6)$alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 1, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 1 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 1, X may include a halide anion or a chalcogenide anion, but may not be limited thereto. For example, in Chemical Formula 1, X may include one kind or two or more kinds of anions, for example, one or more kinds of halide anions, one or more kinds of chalcogenide anions, or mixed anions thereof. For example, in Chemical Formula 1, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 1, X may include one or more kinds of anions selected from the group consisting of $F^-$, $Cl^-$, $Br^-$, $I^-$, and combinations thereof as a monovalent halide anion, but may not be limited thereto. For example, in Chemical Formula 1, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic metal halide in Chemical Formula 1 may include a member or two or more members selected from $CH_3NH_3PbI_xCl_y$ (x and y are real numbers satisfying $0 \leq x \leq 3$, $0 \leq y \leq 3$, and $x+y=3$), $CH_3NH_3PbI_xBr_y$ (x and y are real numbers satisfying $0 \leq x \leq 3$, $0 \leq y \leq 3$, and $x+y=3$), $CH_3NH_3PbCl_xBr_y$ (x and y are real numbers satisfying $0 \leq x \leq 3$, $0 \leq y \leq 3$, and $x+y=3$), and $CH_3NH_3PbI_xF_y$ (x and y are real numbers satisfying $0 \leq x \leq 3$, $0 \leq y \leq 3$, and $x+y=3$), and may include a member or two or more members selected from $(CH_3NH_3)_2PbI_xCl_y$ (x and y are real numbers satisfying $0 \leq x \leq 4$, $0 \leq y \leq 4$, and $x+y=4$), $(CH_3NH_3)_2PbI_xBr_y$ (x and y are real numbers satisfying $0 \leq x \leq 4$, $0 \leq y \leq 4$, and $x+y=4$), $(CH_3NH_3)_2PbCl_xBr_y$ (x and y are real numbers satisfying $0 \leq x \leq 4$, $0 \leq y \leq 4$, and $x+y=4$), and $(CH_3NH_3)_2PbI_xF_y$ (x and y are real numbers satisfying $0 \leq x \leq 4$, $0 \leq y \leq 4$, and $x+y=4$), but may not be limited thereto.

In an embodiment of the present disclosure, the organic metal halide in Chemical Formula 1 may include a member or two or more members selected from $CH_3NH_3PbI_3$ (hereafter, also referred to as "MAPbI$_3$"), $CH_3NH_3PbBr_3$ (hereafter, also referred to as "MAPbBr$_3$"), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but may not be limited thereto.

For example, the organic metal halide in Chemical Formula 1 may include a member or two or more members selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbICl_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but may not be limited thereto.

For example, the organic metal halide in Chemical Formula 1 may include a member or two or more members selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2$ NH$_3$PbClBr$_2$, CH$_3$(CH$_2$)$_2$NH$_3$PbI$_2$Cl, CH$_3$(CH$_2$)$_2$NH$_3$SnF$_2$Br, CH$_3$(CH$_2$)$_2$NH$_3$SnICl$_2$, CH$_3$(CH$_2$)$_2$NH$_3$SnF$_2$I, CH$_3$(CH$_2$)$_2$NH$_3$SnI$_2$Cl, and CH$_3$(CH$_2$)$_2$NH$_3$SnF$_2$Cl, but may not be limited thereto.

For example, the organic metal halide in Chemical Formula 1 may include a member or two or more members selected from CH$_3$(CH$_2$)$_3$NH$_3$PbI$_3$, CH$_3$(CH$_2$)$_3$NH$_3$PbBr$_3$, CH$_3$(CH$_2$)$_3$NH$_3$PbCl$_3$, CH$_3$(CH$_2$)$_3$NH$_3$PbF$_3$, CH$_3$(CH$_2$)$_3$PbBrI$_2$, CH$_3$(CH$_2$)$_3$NH$_3$PbBrCl$_2$, CH$_3$(CH$_2$)$_3$NH$_3$PbIBr$_2$, CH$_3$(CH$_2$)$_3$NH$_3$PbICl$_2$, CH$_3$(CH$_2$)$_3$NH$_3$PbClBr$_2$, CH$_3$(CH$_2$)$_3$NH$_3$PbI$_2$Cl, CH$_3$(CH$_2$)$_3$NH$_3$SnF$_2$Br, CH$_3$(CH$_2$)$_3$NH$_3$SnF$_2$I, and CH$_3$(CH$_2$)$_3$NH$_3$SnF$_2$Cl, but may not be limited thereto.

For example, the organic metal halide having the first perovskite structure according to an embodiment of the present disclosure may be CH$_3$NH$_3$PbI$_3$.

In an embodiment of the present disclosure, the metal halide having the second perovskite crystal structure may be represented by the following Chemical Formula 2, but may not be limited thereto:

$$AMX_3 \quad \text{[Chemical Formula 2]}$$

(In Chemical Formula 2,

A is an alkali metal cation,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 2, A may include an alkali metal cation, but may not be limited thereto. The alkali metal cation may include a cation of a metal selected from the group consisting of Rb, Cs, K, Mg, Ca, Sr, Ba, and combinations thereof, but may not be limited thereto.

In an embodiment of the present disclosure, in Chemical Formula 2, X may include a halide anion or a chalcogenide anion, but may not be limited thereto. For example, in Chemical Formula 2, X may include one kind or two or more kinds of anions, for example, one or more kinds of halide anions, one or more kinds of chalcogenide anions, or mixed anions thereof. For example, in Chemical Formula 2, X may include a member selected from the group consisting of F$^-$, Cl$^-$, Br$^-$, I$^-$, S$^{2-}$, Se$^{2-}$, Te$^{2-}$, and combinations thereof, but may not be limited thereto. For example, in Chemical Formula 2, X may include one or more kinds of anions selected from the group consisting of F$^-$, Cl$^-$, Br$^-$, I$^-$, and combinations thereof as a monovalent halide anion, but may not be limited thereto. For example, in Chemical Formula 2, X may include a member selected from the group consisting of S$^{2-}$, Se$^{2-}$, Te$^{2-}$, and combinations thereof as a divalent chalcogenide anion, but may not be limited thereto.

For example, the metal halide having the second perovskite structure may be selected from the group consisting of RbPbI$_3$, RbPbBr$_3$, RbPbCl$_3$, RbSnI$_3$, RbSnBr$_3$, RbSnCl$_3$, CsPbI$_3$, CsPbBr$_3$, CsPbCl$_3$, CsSnI$_3$, CsSnBr$_3$, CsSnCl$_3$, KPbI$_3$, KPbBr$_3$, KPbCl$_3$, KSnI$_3$, KSnBr$_3$, KSnCl$_3$, and combinations thereof, but may not be limited thereto.

For example, the metal halide having the second perovskite structure according to an embodiment of the present disclosure may be RbPbI$_3$.

In an embodiment of the present disclosure, the polymer protective layer 300 may include an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

A second aspect of the present disclosure relates to a preparing method of the resistive random access memory device, including: forming the resistance change layer 200 on the first electrode 100; and forming the second electrode 400 on the resistance change layer 200, and the resistance change layer 200 is formed by spin-coating of a solution containing an organic halide, an alkali metal halide, and a metal halide.

Figure 2:
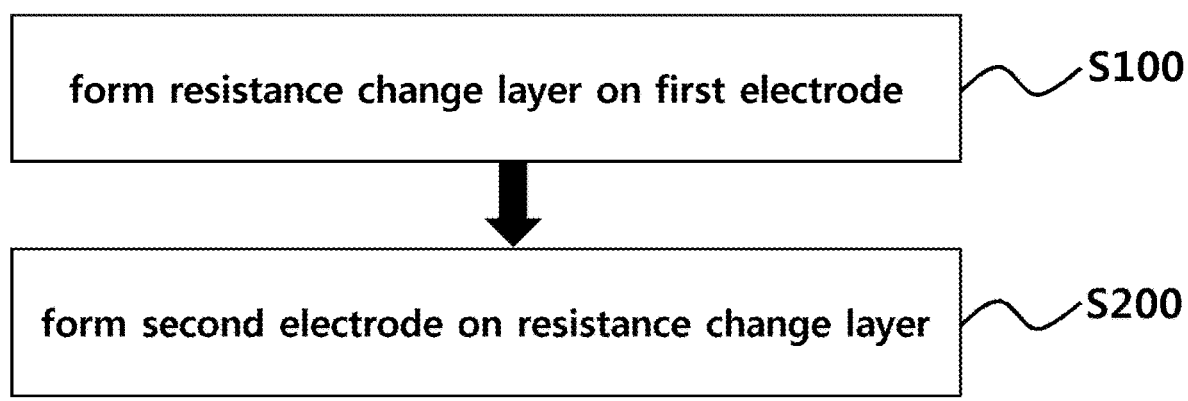
FIG. 2 is a flowchart showing a preparing method of a resistive random access memory device according to an embodiment of the present disclosure.

Hereafter, the preparing method will be described with reference to FIG. 2.

The resistance change layer 200 is formed on the first electrode 100 (S100).

In an embodiment of the present disclosure, the preparing method may further include forming a hydrophilic group on a surface of the first electrode 100 by performing UV ozone treatment to the first electrode 100 before the forming of the resistance change layer 200, but may not be limited thereto.

The hydrophilic group may be selected from the group consisting of a carboxyl group, an amine group, an ether group, a hydroxyl group, a tertiary ammonium group, and combinations thereof. The hydrophilic group is formed on the first electrode 100 to improve the invasiveness of the substrate.

In an embodiment of the present disclosure, the solution may contain the organic halide, the alkali metal halide, and the metal halide at a molar ratio of 1−x:x:1 (0.1≤x≤0.8), but may not be limited thereto.

As the molar ratio of the alkali metal halide increases, the durability and on/off ratio of the resistive random access memory device increases. Therefore, the life and reliability of the resistive random access memory device may be increased.

The resistance change layer 200 may be is formed by spin-coating of a solution containing an organic halide, an alkali metal halide, and a metal halide on the first electrode 100, but may not be limited thereto.

The spin-coating is a method for coating a thin film of the solution on the substrate by spinning the substrate at high speed, and, thus, the solvent can be volatilized rapidly. Further, the spin-coating is advantageous when coating a low-viscosity solution.

Then, the second electrode 400 is formed on the resistance change layer 200 (S200).

In an embodiment of the present disclosure, the resistive random access memory device may further include the polymer protective layer 300 formed on the resistance change layer 200, but may not be limited thereto. The polymer protective layer 300 may be formed by spin-coating, on the resistance change layer 200, an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

In an embodiment of the present disclosure, the first electrode 100 and the second electrode 200 may each independently include a material selected from the group consisting of a metal, a conductive polymer, a carbonaceous material, and combinations thereof, but may not be limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but may not be limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but may not be limited thereto.

The carbonaceous material may include a carbonaceous material selected from the group consisting of carbon nanotube, graphene, fullerene, carbon nanofiber, and combinations thereof, but may not be limited thereto.

In an embodiment of the present disclosure, the organic halide may be represented by the following Chemical Formula 3, but may not be limited thereto:

RX                    [Chemical Formula 3]

(In Chemical Formula 3,

R is a substituted or unsubstituted $C_{1-24}$ alkyl group, and when R is substituted, its substituent is an amino group, a hydroxyl group, a cyano group, a halogen group, a nitro group, or a methoxy group, and X includes a halide anion or a chalcogenide anion).

In an embodiment of the present disclosure, in Chemical Formula 3, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R is a monovalent organic ammonium ion represented by $(R^5—NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R may be represented by Chemical Formula $(R^6R^7N=CH—NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto: an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol, —SH), an alkylthio group having 1 to 10 carbon atoms, an arylthio group, a sulfonyl group, a phosphate group, a phosphate ester group, a phosphonic acid group, and a phosphonate ester group. For example, the substituted alkyl group may include a halogen alkyl group, a hydroxy alkyl group, an amino alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2—$), a benzhydryl group ($Ph_2CH—$), a trityl group (triphenylmethyl, $Ph_3C—$), phenethyl (Ph-$CH_2CH_2—$), a styryl group (PhCH=CH—), or a cinnamyl group (PhCH=CHCH$_2$—), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—NH$_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto: an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphate group, a phosphate ester group, a phosphonic acid group, and a sulfonyl group. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—($C_1$-$C_6$)alkylene] or Chemical Formula [—X—($C_1$-$C_6$)alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 1, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 1 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 1, X may include a halide anion or a chalcogenide anion, but may not be limited thereto. For example, in Chemical Formula 1, X may include one kind or two or more kinds of anions, for example, one or more kinds of halide anions, one or more kinds of chalcogenide anions, or mixed anions thereof. For example, in Chemical Formula 1, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 1, X may include one or more kinds of anions selected from the group consisting of $F^-$, $Cl^-$, $Br^-$, $I^-$, and combinations thereof as a monovalent halide anion, but may not be limited thereto. For example, in Chemical Formula 1, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic metal halide in Chemical Formula 1 may include a member or two or more members selected from $CH_3NH_3PbI_xCl_y$ (x and y are real numbers satisfying 0≤x≤3, 0≤y≤3, and x+y=3), $CH_3NH_3PbI_xBr_y$ (x and y are real numbers satisfying 0≤x≤3, 0≤y≤3, and x+y=3), $CH_3NH_3PbCl_xBr_y$ (x and y are real numbers satisfying 0≤x≤3, 0≤y≤3, and x+y=3), and $CH_3NH_3PbI_xF_y$ (x and y are real numbers satisfying 0≤x≤3, 0≤y≤3, and x+y=3), and may include a member or two or more members selected from $(CH_3NH_3)_2PbI_xCl_y$ (x and y are real numbers satisfying 0≤x≤4, 0≤y≤4, and x+y=4), $(CH_3NH_3)_2PbI_xBr_y$ (x and y are real numbers satisfying 0≤x≤4, 0≤y≤4, and x+y=4), $(CH_3NH_3)_2PbCl_xBr_y$ (x and y are real numbers satisfying 0≤x≤4, 0≤y≤4, and x+y=4), and $(CH_3NH_3)_2PbI_xF_y$ (x and y are real numbers satisfying 0≤x≤4, 0≤y≤4, and x+y=4), but may not be limited thereto.

In an embodiment of the present disclosure, the organic metal halide in Chemical Formula 1 may include a member or two or more members selected from $CH_3NH_3PbI_3$ (hereafter, also referred to as "$MAPbI_3$"), $CH_3NH_3PbBr_3$ (hereafter, also referred to as "$MAPbBr_3$"), $CH_3NH_3PbCl_3$, $CH_3NH_3PbF_3$, $CH_3NH_3PbBr_{12}$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but may not be limited thereto.

For example, the organic metal halide in Chemical Formula 1 may include a member or two or more members selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbICl_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but may not be limited thereto.

For example, the organic metal halide in Chemical Formula 1 may include a member or two or more members selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2NH_3PbClBr_2$, $CH_3(CH_2)_2NH_3PbI_2Cl$, $CH_3(CH_2)_2$ $NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but may not be limited thereto.

For example, the organic metal halide in Chemical Formula 1 may include a member or two or more members selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF_2Cl$, but may not be limited thereto.

For example, the organic metal halide having the first perovskite structure according to an embodiment of the present disclosure may include $CH_3NH_3PbI_3$.

In an embodiment of the present disclosure, the metal halide having the second perovskite crystal structure may be represented by the following Chemical Formula 2, but may not be limited thereto:

$$AMX_3 \qquad \text{[Chemical Formula 2]}$$

(In Chemical Formula 2,

A is an alkali metal cation,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 2, A may include an alkali metal cation, but may not be limited thereto. The alkali metal cation may include a cation of a metal selected from the group consisting of Rb, Cs, K, Mg, Ca, Sr, Ba, and combinations thereof, but may not be limited thereto.

In an embodiment of the present disclosure, in Chemical Formula 2, X may include a halide anion or a chalcogenide anion, but may not be limited thereto. For example, in Chemical Formula 2, X may include one kind or two or more kinds of anions, for example, one or more kinds of halide anions, one or more kinds of chalcogenide anions, or mixed anions thereof. For example, in Chemical Formula 2, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 2, X may include one or more kinds of anions selected from the group consisting of $F^-$, $Cl^-$, $Br^-$, $I^-$, and combinations thereof as a monovalent halide anion, but may not be limited thereto. For example, in Chemical Formula 2, X may include a member selected from the group consisting of $S^{2-}$, $Se^{2-}$, $Te^{2-}$, and combinations thereof as a divalent chalcogenide anion, but may not be limited thereto.

For example, the metal halide having the second perovskite structure may be selected from the group consisting of $RbPbI_3$, $RbPbBr_3$, $RbPbCl_3$, $RbSnI_3$, $RbSnBr_3$, $RbSnCl_3$, $CsPbI_3$, $CsPbBr_3$, $CsPbCl_3$, $CsSnI_3$, $CsSnBr_3$, $CsSnCl_3$, $KPbI_3$, $KPbBr_3$, $KPbCl_3$, $KSnI_3$, $KSnBr_3$, $KSnCl_3$, and combinations thereof, but may not be limited thereto.

For example, the metal halide having the second perovskite structure according to an embodiment of the present disclosure may include $RbPbI_3$.

In an embodiment of the present disclosure, the polymer protective layer 300 may include an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

A second aspect of the present disclosure relates to a preparing method of the resistive random access memory device, including: forming the resistance change layer 200 on the first electrode 100; and forming the second electrode 400 on the resistance change layer 200, and the resistance change layer 200 is formed by spin-coating of a solution containing an organic halide, an alkali metal halide, and a metal halide.

Hereafter, the preparing method will be described with reference to FIG. 2.

The resistance change layer 200 is formed on the first electrode 100 (S100).

In an embodiment of the present disclosure, the preparing method may further include forming a hydrophilic group on a surface of the first electrode 100 by performing UV ozone treatment to the first electrode 100 before the forming of the resistance change layer 200, but may not be limited thereto.

The hydrophilic group may be selected from the group consisting of a carboxyl group, an amine group, an ether group, a hydroxyl group, a tertiary ammonium group, and combinations thereof. The hydrophilic group is formed on the first electrode 100 to improve the invasiveness of the substrate.

In an embodiment of the present disclosure, the solution may contain the organic halide, the alkali metal halide, and the metal halide at a molar ratio of 1−x:x:1 (0.1≤x≤0.8), but may not be limited thereto.

As the molar ratio of the alkali metal halide increases, the durability and on/off ratio of the resistive random access memory device increases. Therefore, the life and reliability of the resistive random access memory device may be increased.

The resistance change layer 200 may be is formed by spin-coating of a solution containing an organic halide, an alkali metal halide, and a metal halide on the first electrode 100, but may not be limited thereto.

The spin-coating is a method for coating a thin film of the solution on the substrate by spinning the substrate at high speed, and, thus, the solvent can be volatilized rapidly. Further, the spin-coating is advantageous when coating a low-viscosity solution.

Then, the second electrode 400 is formed on the resistance change layer 200 (S200).

In an embodiment of the present disclosure, the resistive random access memory device may further include the polymer protective layer 300 formed on the resistance change layer 200, but may not be limited thereto. The polymer protective layer 300 may be formed by spin-coating, on the resistance change layer 200, an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof, but may not be limited thereto.

In an embodiment of the present disclosure, the first electrode 100 and the second electrode 200 may each independently include a material selected from the group consisting of a metal, a conductive polymer, a carbonaceous material, and combinations thereof, but may not be limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but may not be limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but may not be limited thereto.

The carbonaceous material may include a carbonaceous material selected from the group consisting of carbon nanotube, graphene, fullerene, carbon nanofiber, and combinations thereof, but may not be limited thereto.

In an embodiment of the present disclosure, the organic halide may be represented by the following Chemical Formula 3, but may not be limited thereto:

RX        [Chemical Formula 3]

(In Chemical Formula 3,

R is a substituted or unsubstituted $C_{1-24}$ alkyl group, and when R is substituted, its substituent is an amino group, a hydroxyl group, a cyano group, a halogen group, a nitro group, or a methoxy group, and X includes a halide anion or a chalcogenide anion).

In an embodiment of the present disclosure, in Chemical Formula 3, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 3, R is a monovalent organic ammonium ion represented by $(R^5—NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 3, R may be represented by Chemical Formula $(R^6R^7N=CH—NR^8N^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto: an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol, —SH), an alkylthio group having 1 to 10 carbon atoms, an arylthio group, a sulfonyl group, a phosphate group, a phosphate ester group, a phosphonic acid group, and a phosphonate ester group. For example, the substituted alkyl group may include a halogen alkyl group, a hydroxy alkyl group, an amino alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2$—), a benzhydryl group ($Ph_2CH$—), a trityl group (triphenylmethyl, $Ph_3C$—), phenethyl (Ph-$CH_2CH_2$—), a styryl group (PhCH=CH—), or a cinnamyl group (PhCH=CHCH$_2$—), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—NH$_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto: an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphate group, a phosphate ester group, a phosphonic acid group, and a sulfonyl group. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—($C_1$-$C_6$)alkylene] or Chemical Formula [—X—($C_1$-$C_6$)alkylene-X—]. Herein, X may be selected from O, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 3, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 3 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 3, X may include a halide anion or a chalcogenide anion, but may not be limited thereto. For example, in Chemical Formula 3, X may include one kind or two or more kinds of anions, for example, one or more kinds of halide anions, one or more kinds of chalcogenide anions, or mixed anions thereof. For example, in Chemical Formula 3, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 3, X may include one or more kinds of anions selected from the group consisting of $F^-$, $Cl^-$, $Br^-$, $I^-$, and combinations thereof as a monovalent halide anion, but may not be limited thereto. For example, in Chemical Formula 3, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic halide in Chemical Formula 3 may include a member or two or more members selected from $CH_3NH_3I$, $CH_3NH_3Br$, $CH_3NH_3Cl$, and $CH_3NH_3F$, but may not be limited thereto.

In an embodiment of the present disclosure, the organic halide in Chemical Formula 3 may include a member or two or more members selected from $CH_3CH_2NH_3I$, $CH_3CH_2NH_3Br$, $CH_3CH_2NH_3Cl$, and $CH_3CH_2NH_3F$, but may not be limited thereto.

In an embodiment of the present disclosure, the organic halide in Chemical Formula 3 may include a member or two or more members selected from $CH_3(CH_2)_2NH_3I$, $CH_3(CH_2)_2NH_3Br$, $CH_3(CH_2)_2NH_3Cl$, and $CH_3(CH_2)_2NH_3F$, but may not be limited thereto.

In an embodiment of the present disclosure, the organic halide in Chemical Formula 3 may include a member or two or more members selected from $CH_3(CH_2)_3NH_3I$, $CH_3(CH_2)_3NH_3Br$, $CH_3(CH_2)_3NH_3Cl$, and $CH_3(CH_2)_3NH_3F$, but may not be limited thereto.

For example, the organic halide according to an embodiment of the present disclosure may include $CH_3NH_3I$.

In an embodiment of the present disclosure, the alkali metal halide may be represented by the following Chemical Formula 4, but may not be limited thereto:

$$AX \qquad \text{[Chemical Formula 4]}$$

(In Chemical Formula 4,
A is an alkali metal cation, and
X includes a halide anion or a chalcogenide anion).

In an embodiment of the present disclosure, in Chemical Formula 4, A may include an alkali metal cation, but may not be limited thereto. The alkali metal cation may include a cation of a metal selected from the group consisting of Rb, Cs, K, Mg, Ca, Sr, Ba, and combinations thereof, but may not be limited thereto.

In an embodiment of the present disclosure, in Chemical Formula 4, X may include a halide anion or a chalcogenide anion, but may not be limited thereto. For example, in Chemical Formula 4, X may include one kind or two or more kinds of anions, for example, one or more kinds of halide anions, one or more kinds of chalcogenide anions, or mixed anions thereof. For example, in Chemical Formula 4, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 4, X may include one or more kinds of anions selected from the group consisting of $F^-$, $Cl^-$, $Br^-$, $I^-$, and combinations thereof as a monovalent halide anion, but may not be limited thereto. For example, in Chemical Formula 4, X may include a member selected from the group consisting of $S^{2-}$, $Se^{2-}$, $Te^{2-}$, and combinations thereof as a divalent chalcogenide anion, but may not be limited thereto.

For example, the alkali metal halide in Chemical Formula 4 may include a member selected from the group consisting of RbI, RbBr, RbCl, RbF, CsI, CsBr, CsCl, CsF, KI, KBr, KCl, KF, and combinations thereof, but may not be limited thereto.

For example, the alkali metal halide according to an embodiment of the present disclosure may include RbI.

In an embodiment of the present disclosure, the metal halide may be represented by the following Chemical Formula 5, but may not be limited thereto:

$$MX_2 \quad \text{[Chemical Formula 5]}$$

(In Chemical Formula 5,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

In an embodiment of the present disclosure, in Chemical Formula 5, X may include a halide anion or a chalcogenide anion, but may not be limited thereto. For example, in Chemical Formula 5, X may include one kind or two or more kinds of anions, for example, one or more kinds of halide anions, one or more kinds of chalcogenide anions, or mixed anions thereof. For example, in Chemical Formula 5, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 5, X may include one or more kinds of anions selected from the group consisting of $F^-$, $Cl^-$, $Br^-$, $I^-$, and combinations thereof as a monovalent halide anion, but may not be limited thereto. For example, in Chemical Formula 5, X may include a member selected from the group consisting of $S^{2-}$, $Se^{2-}$, $Te^{2-}$, and combinations thereof as a divalent chalcogenide anion, but may not be limited thereto.

For example, the metal halide in Chemical Formula 5 may include a member selected from the group consisting of $PbI_2$, $PbBr_2$, $PbCl_2$, $PbF_2$, $SnI_2$, $SnBr_2$, $SnCl_2$, $SnF_2$, PbS, PbSe, PbTe, SnS, SnSe, SnTe, and combinations thereof, but may not be limited thereto.

For example, the metal halide according to an embodiment of the present disclosure may include $PbI_2$.

In an embodiment of the present disclosure, the solvent may be selected from the group consisting of dimethylformamide, dimethylsulfoxide, dimethylacetamide, N-methylpyrrolidone, N-methyl-2-pyridine, pyridine, aniline, and combinations thereof, but may not be limited thereto. Desirably, the solvent may include dimethylformamide and dimethylsulfoxide.

Hereafter, the present disclosure will be described in more detail with reference to examples. The following examples are provided only for explanation, but do not intend to limit the scope of the present disclosure.

[Example 1] Preparation of Resistance Change Layer

A silicon substrate on which a Pt/Ti electrode was deposited was prepared, and a hydrophilic group was formed on a surface of the silicon substrate by performing UV ozone treatment thereto.

Then, $CH_3NH_3I_3$, RbI, and $PbI_2$ were mixed at a molar ratio of 0.5:0.5:1 and the mixture was dissolved in dimethylformamide and dimethyl sulfoxide to a concentration of 55 wt % to prepare a precursor solution. The solution was spin-coated on the surface of the silicon substrate to prepare a resistance change layer.

[Example 2] Preparation of Resistance Change Layer

A resistance change layer was prepared in the same manner as in Example 1 except that $CH_3NH_3I_3$, RbI, and $PbI_2$ were mixed at a molar ratio of 0.3:0.7:1 instead of 0.5:0.5:1.

Comparative Example 1

In order to check how an alkali metal halide RbI, which is the greatest feature of the present disclosure, affects the characteristics of a resistive random access memory device, a resistance change layer was prepared as Comparative Example 1. The resistance change layer was prepared in the same manner as in Example 1 except that $CH_3N H_3I_3$, RbI, and $PbI_2$ were mixed at a molar ratio of 1:0:1 instead of 0.5:0.5:1.

[Example 3] Preparation of Resistive Random Access Memory Device

A polymer protective layer was prepared by spin-coating polymethyl methacrylate (2 mg/ml in chlorobenzene) on the resistance change layer of Example 1.

A second electrode was formed by depositing silver to 50 nm or more on the polymer protective layer under $10^{-6}$ torr to prepare a resistive random access memory device.

[Example 4] Preparation of Resistive Random Access Memory Device

A resistive random access memory device was prepared in the same manner as in Example 3 except that the resistance change layer of Example 2 was used instead of the resistance change layer of Example 1.

Comparative Example 2

In order to check how an alkali metal halide RbI, which is the greatest feature of the present disclosure, affects the characteristics of a resistive random access memory device, a resistive random access memory device was prepared as Comparative Example 2. The resistive random access memory device was prepared in the same manner as in Example 3 except that the resistance change layer of Comparative Example 1 was used instead of the resistance change layer of Example 1.

Test Example

Figure 3:
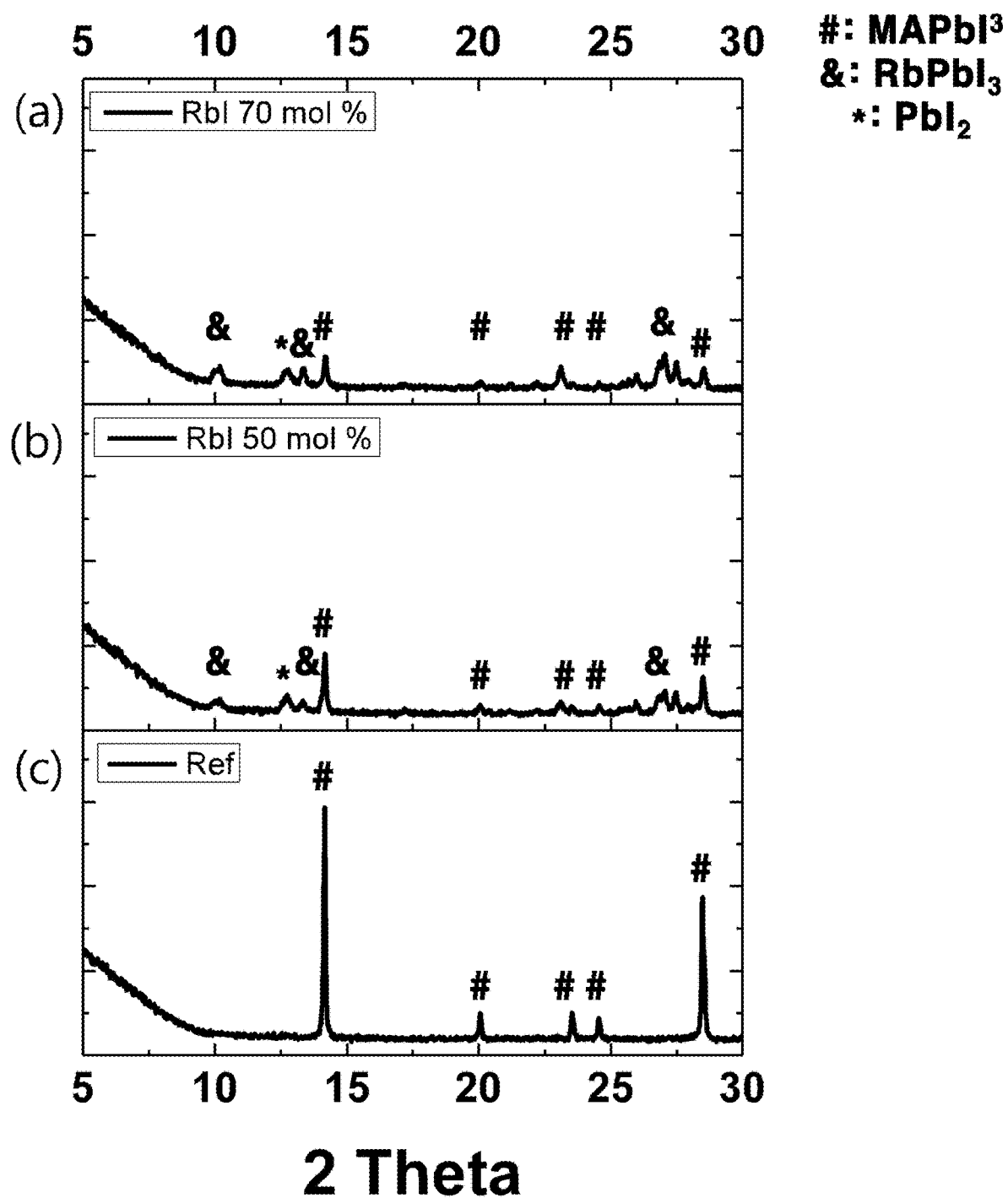
FIG. 3 is graphs showing X-ray diffraction patterns of resistance change layers of resistive random access memory devices according to examples and a comparative example, respectively, of the present disclosure.

FIG. 3(a) through FIG. 3(c) are graphs showing X-ray diffraction patterns of resistance change layers of resistive random access memory devices according to Example 4 (FIG. 3(a)) and Example 3 (FIG. 3(b)) and Comparative Example 2 (FIG. 3(c)), respectively, of the present disclosure.

Referring to FIG. 3(a) and FIG. 3(b), it can be seen that the resistance change layers of the resistive random access memory devices according to Example 4 and Example 3, respectively, contain $CH_3NH_3PbI_3$, $RbPbI_3$, and $PbI_2$. Meanwhile, referring to FIG. 3(c), the resistance change layer of the resistive random access memory device according to Comparative Example 2 contains $CH_3NH_3PbI_3$ only.

Figure 4:
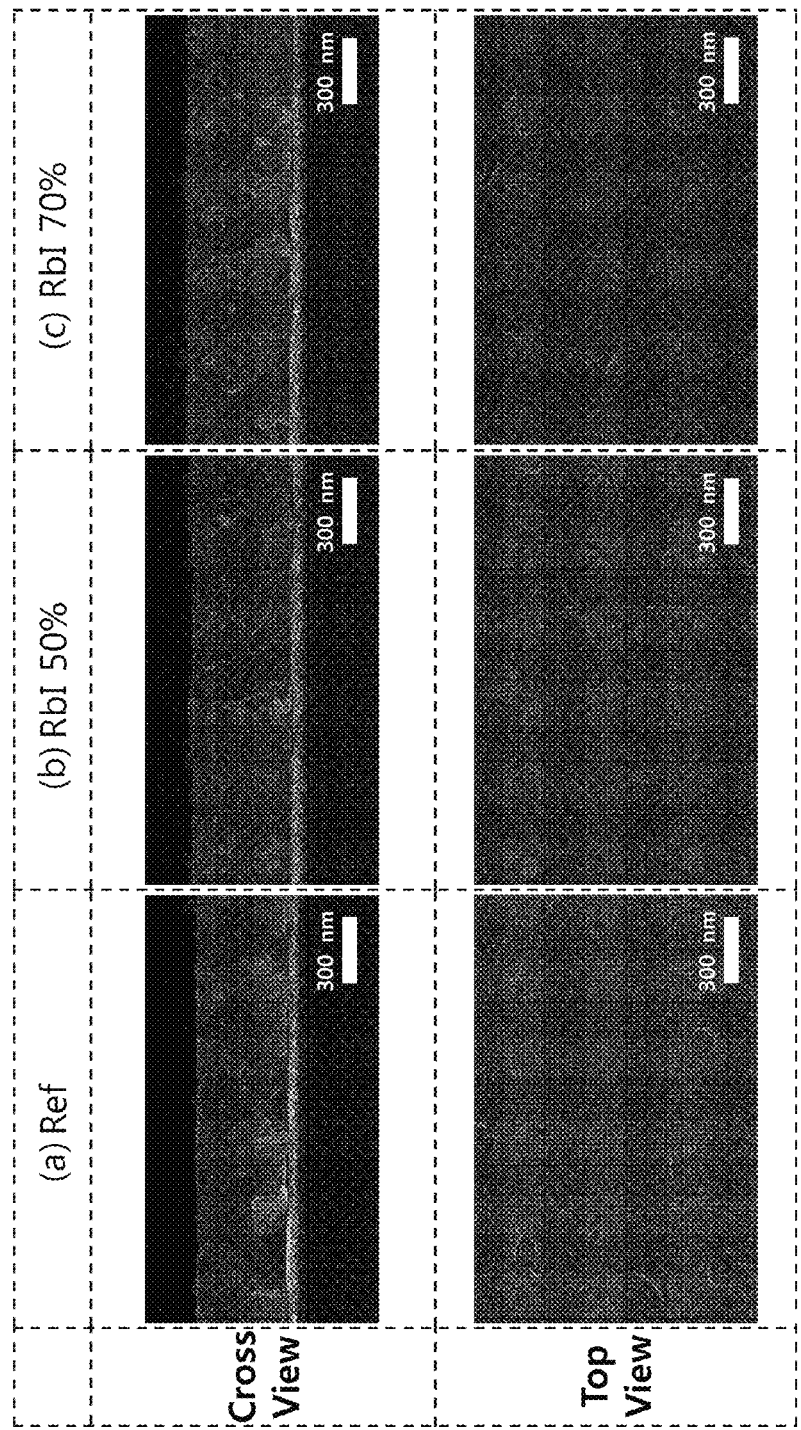
FIG. 4 is scanning electron microscopic images showing cross-sections of resistance change layers of the resistive random access memory devices according to examples and a comparative example, respectively, of the present disclosure.

FIG. 4(a) through FIG. 4(c) are scanning electron microscopic images showing cross-sections of resistance change layers of the resistive random access memory devices according to Comparative Example 2 (FIG. 4(a)), Example 3 (FIG. 4(b)), and Example 4 (FIG. 4(c)), respectively, of the present disclosure.

Referring to FIG. 4(a) through FIG. 4(c), it could be seen that as the mol concentration of RbI increased, the crystal size decreased, but a uniform thin film without pinholes was formed regardless of the mol concentration of RbI.

Figure 5A:
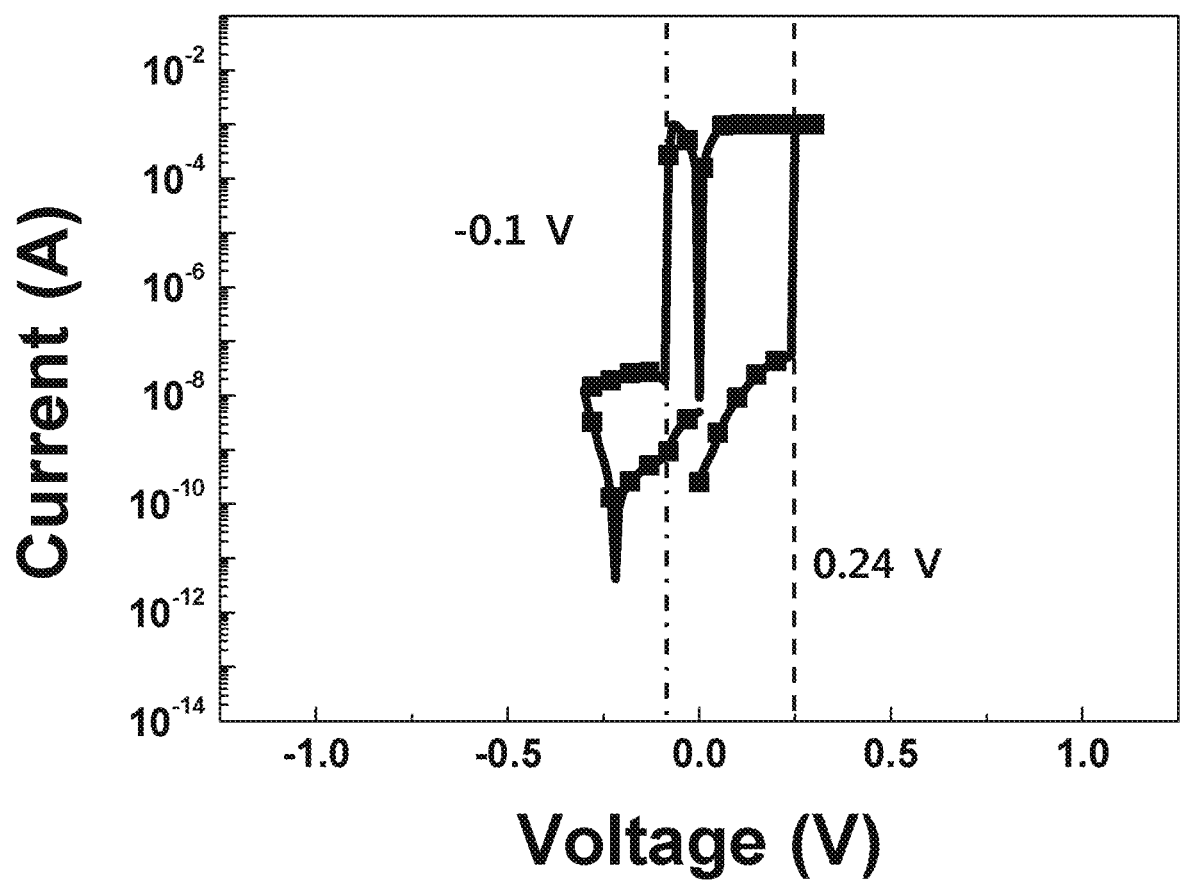
FIG. 5A through FIG. 5C are graphs showing the relationship between voltage and current measured from the resistive random access memory devices according to examples and a comparative example, respectively, of the present disclosure.
Figure 5B:
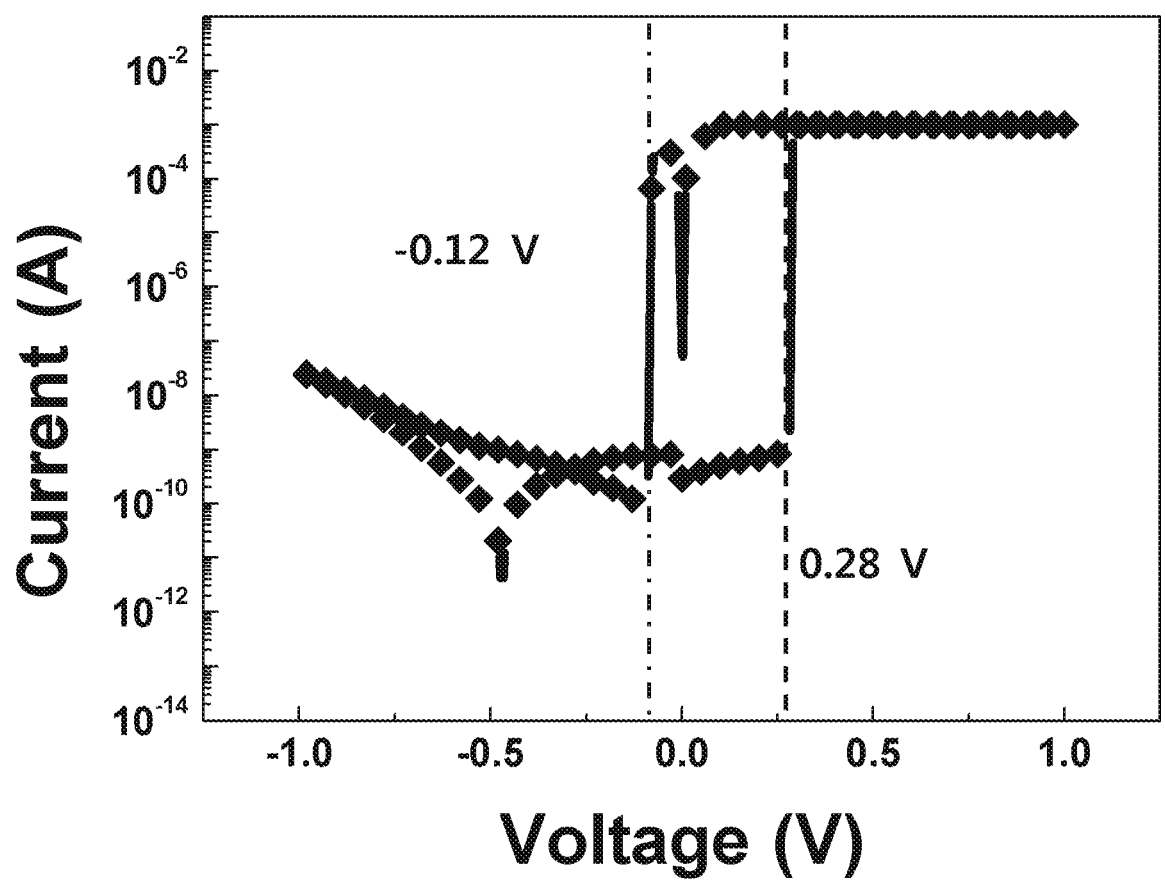
Figure 5C:
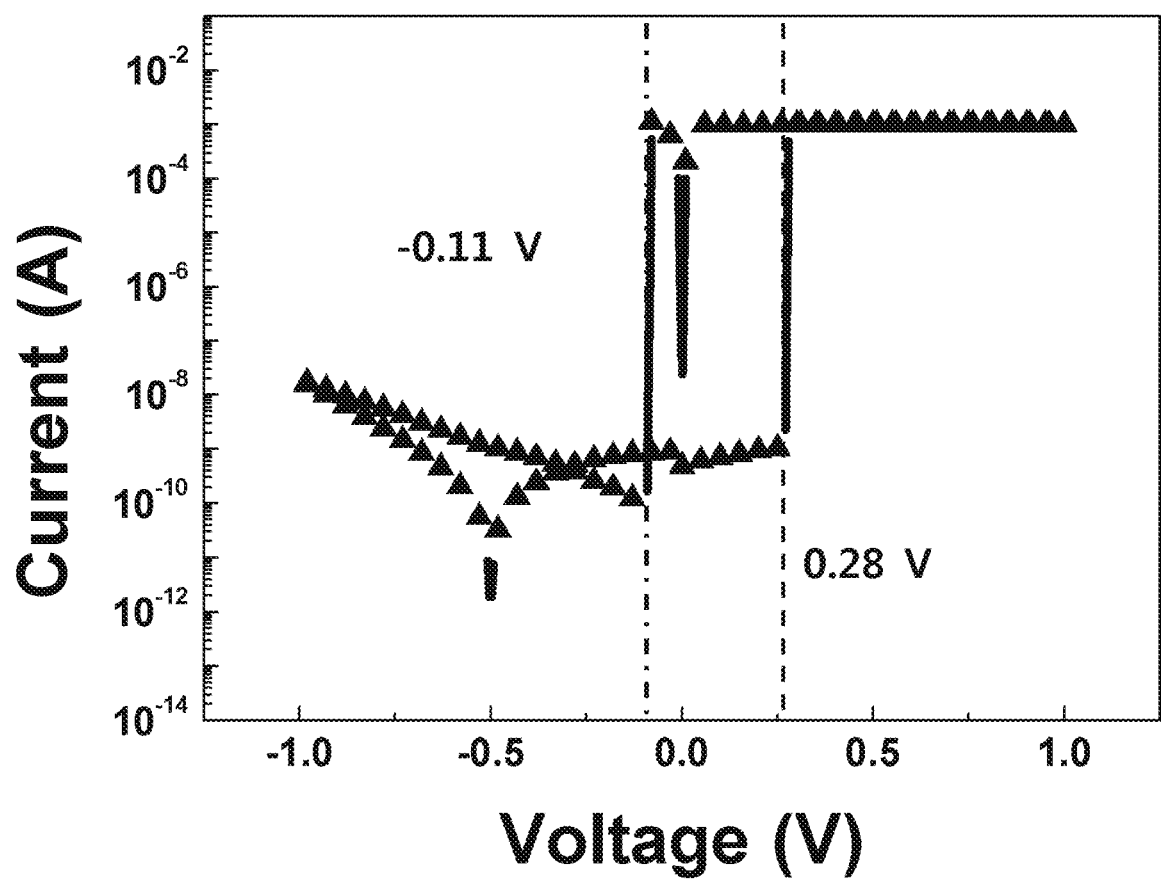

FIG. 5(a) through FIG. 5(c) are graphs showing the relationship between voltage and current measured from the resistive random access memory devices according to Comparative Example 2 (FIG. 5(a)), Example 3 (FIG. 5(b)), and Example 4 (FIG. 5(c)), respectively, of the present disclosure.

Referring to FIG. 5(a) through FIG. 5(c), it could be seen that as the mol concentration of RbI increased, the SET voltage and RESET voltage increased. The resistive random access memory devices according to Examples 3 and 4, respectively, were still driven at low power with a very small change as compared with the resistive random access memory device according to Comparative Example 2.

Figure 6A:
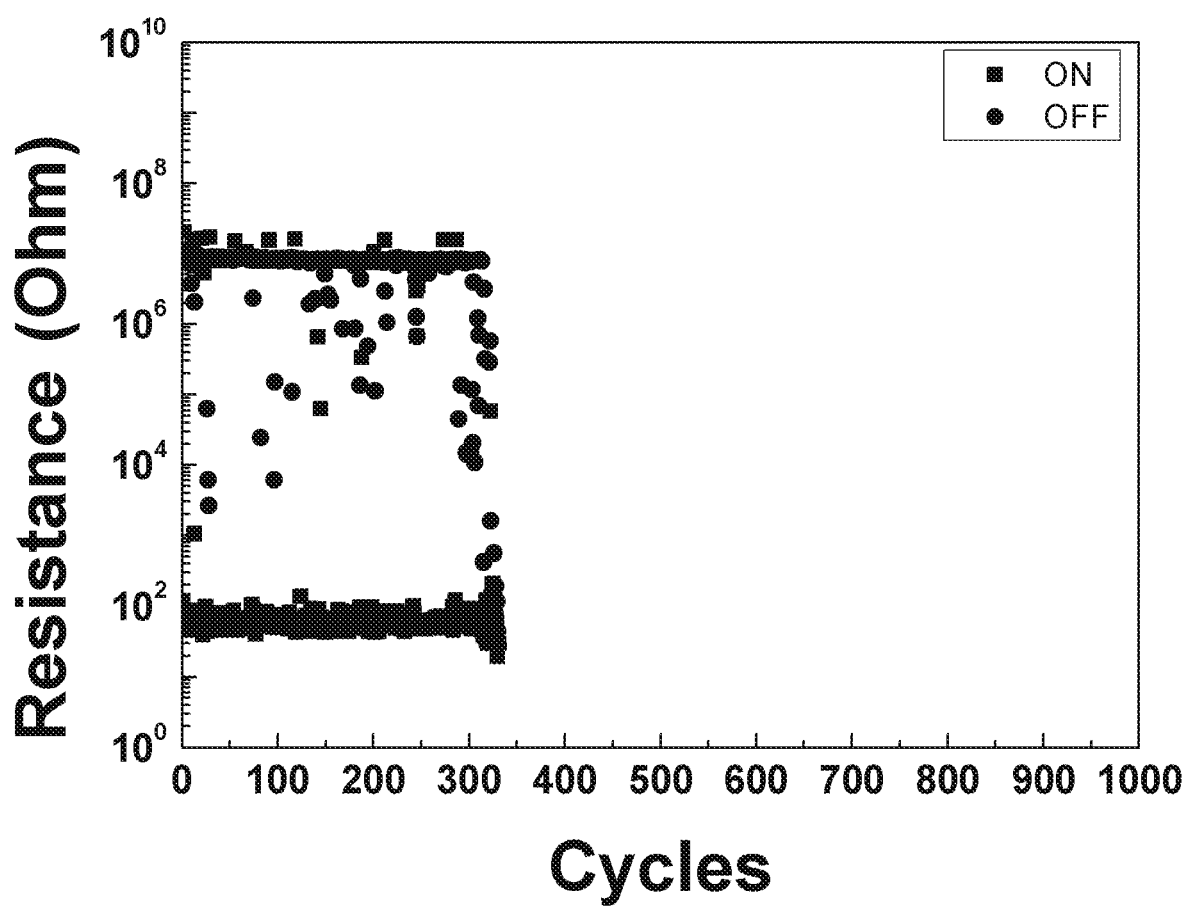
FIG. 6A through FIG. 6C are graphs showing the durability measured from the resistive random access memory devices according to examples and a comparative example, respectively, of the present disclosure.
Figure 6B:
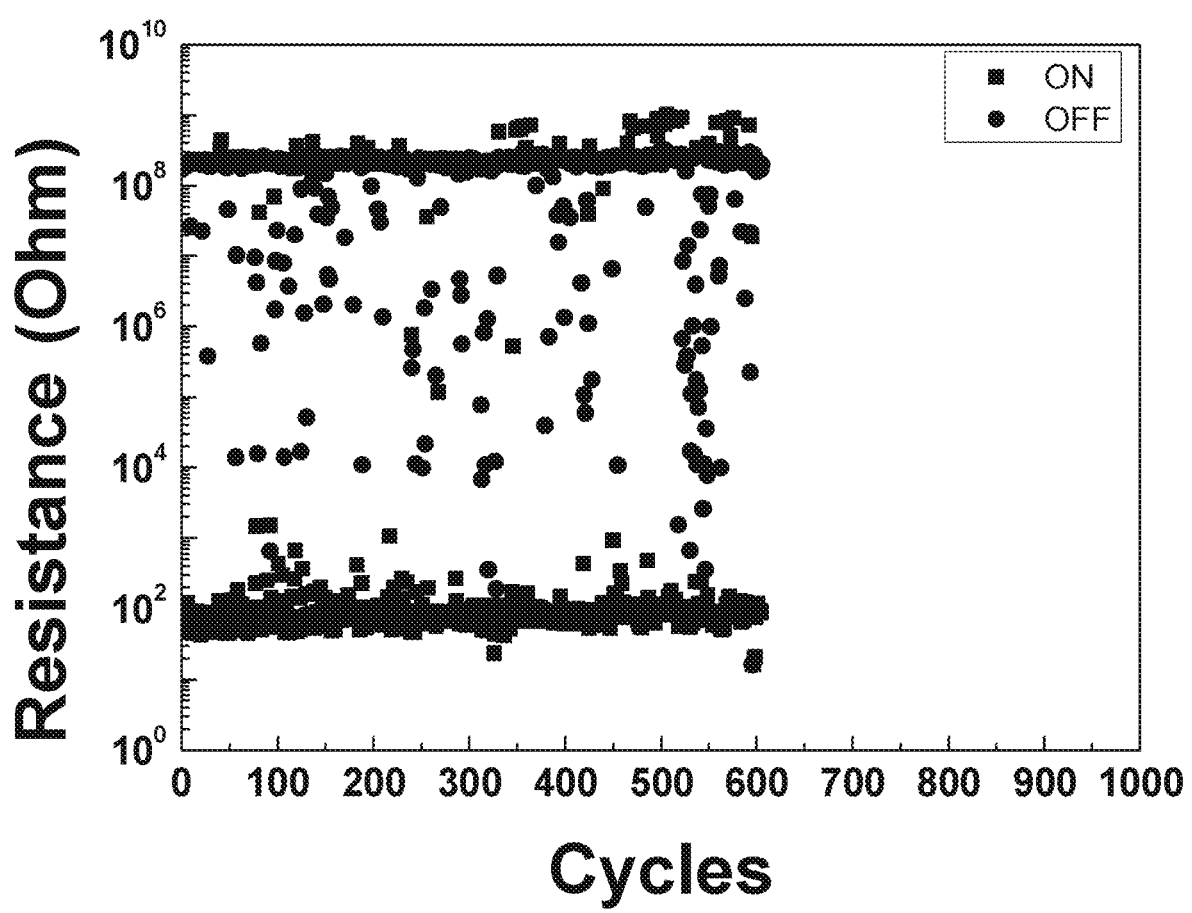
Figure 6C:
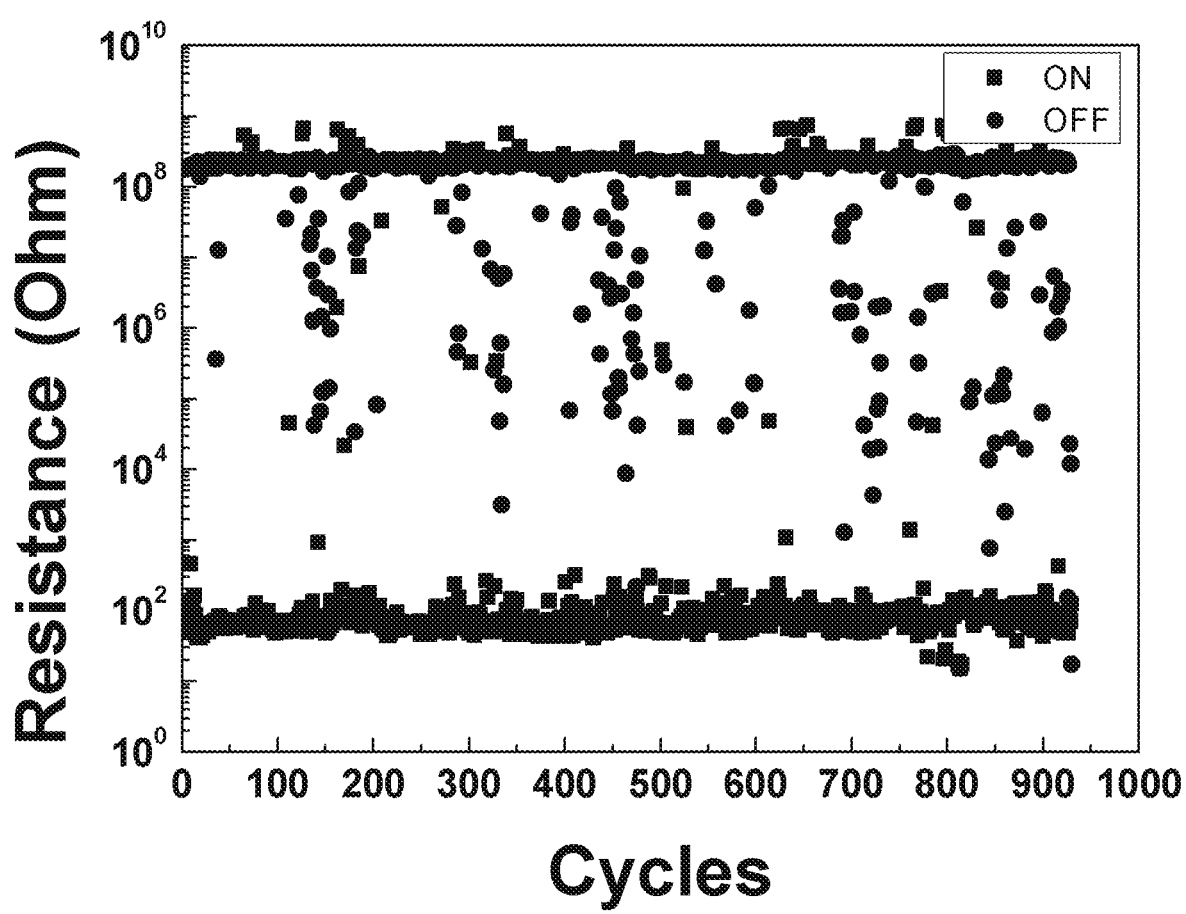

FIG. 6(a) through FIG. 6(c) are graphs showing the durability measured from the resistive random access memory devices according to Comparative Example 2 (FIG. 6(a)), Example 3 (FIG. 6(b)), and Example 4 (FIG. 6(c)), respectively, of the present disclosure.

Referring to FIG. 6(a) through FIG. 6(c), as the mol concentration of RbI increased, the durability of the resistive random access memory device increased two or three times, and, thus, the life of the resistive random access memory device increased. Further, as the mol concentration of RbI increased, the on/off ratio also increased. It could be seen that the increase of the on/off ratio resulted in an increase in reliability of the resistive random access memory device.

The above description of the present disclosure is provided for the purpose of illustration, and it would be understood by a person with ordinary skill in the art that various changes and modifications may be made without changing technical conception and essential features of the present disclosure.

Thus, it is clear that the above-described embodiments are illustrative in all aspects and do not limit the present disclosure. For example, each component described to be of a single type can be implemented in a distributed manner. Likewise, components described to be distributed can be implemented in a combined manner. The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

100: First electrode
200: Resistance change layer
300: Polymer protective layer
400: Second electrode

We claim:

1. A resistive random access memory device, comprising: a resistance change layer formed on a first electrode; and a second electrode formed on the resistance change layer, wherein the resistance change layer comprises an organic metal halide having a first perovskite crystal structure including a tetragonal perovskite structure and a metal halide having a second perovskite crystal structure including an orthorhombic perovskite structure, wherein the resistance change layer comprises 10 wt % or more of the metal halide having the second perovskite crystal structure than the organic metal halide having the first perovskite crystal structure, wherein the organic metal halide having the first perovskite crystal structure is represented by the following Chemical Formula 1, and the metal halide having the second perovskite crystal structure is represented by the following Chemical Formula 2:

$$RMX_3 \qquad \text{[Chemical Formula 1]}$$

$$AMX_3 \qquad \text{[Chemical Formula 2]}$$

(In Chemical Formula 1 and Chemical Formula 2,

R is a substituted or unsubstituted $C_{1-24}$ alkyl group, and when R is substituted, its substituent is an amino group, a hydroxyl group, a cyano group, a halogen group, a nitro group, or a methoxy group, A is an alkali metal cation, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

2. A resistive random access memory device, comprising: a resistance change layer formed on a first electrode; and a second electrode formed on the resistance change layer, wherein the resistance change layer comprises an organic metal halide having a first perovskite crystal structure and a metal halide having a second perovskite crystal structure, and wherein the resistance change layer comprises 10 wt % or more of the metal halide having the second perovskite crystal structure than the organic metal halide having the first perovskite crystal structure different from the second perovskite crystal structure.

3. The resistive random access memory device of claim 2, further comprising:
a polymer protective layer formed on the resistance change layer.

4. The resistive random access memory device of claim 3, wherein the polymer protective layer includes an ionic conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly(2-methoxy ethyl glycidyl ether), and combinations thereof.

5. The resistive random access memory device of claim 2, wherein the organic metal halide having the first perovskite crystal structure has a tetragonal perovskite structure.

6. The resistive random access memory device of claim 5, wherein the organic metal halide having the first perovskite crystal structure is represented by the following Chemical Formula 1:

$$RMX_3 \qquad \text{[Chemical Formula 1]}$$

(In Chemical Formula 1,

R is a substituted or unsubstituted $C_{1-24}$ alkyl group, and when R is substituted, its substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

7. The resistive random access memory device of claim 2, wherein the metal halide having the second perovskite crystal structure has an orthorhombic perovskite structure.

8. The resistive random access memory device of claim 7, wherein the metal halide having the second perovskite crystal structure is represented by the following Chemical Formula 2:

$$AMX_3 \quad \text{[Chemical Formula 2]}$$

(In Chemical Formula 2,

A is an alkali metal cation,

M includes a metal cation selected from the group consisting of Pb, Sn, Ge, Cu, Ni, Co, Fe, Mn, Cr, Pd, Cd, Yb, and combinations thereof, and X includes a halide anion or a chalcogenide anion).

* * * * *